United States Patent
Choi et al.

(10) Patent No.: US 9,236,531 B2
(45) Date of Patent: Jan. 12, 2016

(54) LIGHT EMITTING DEVICE AND LIGHTING SYSTEM

(71) Applicant: LG INNOTEK CO., LTD., Seoul (KR)

(72) Inventors: Eun Sil Choi, Seoul (KR); Dong Wook Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/307,539

(22) Filed: Jun. 18, 2014

(65) Prior Publication Data

US 2014/0367639 A1    Dec. 18, 2014

(30) Foreign Application Priority Data

Jun. 18, 2013    (KR) .................. 10-2013-0069782

(51) Int. Cl.
    H01L 29/06     (2006.01)
    H01L 33/00     (2010.01)
    H01L 21/00     (2006.01)
    H01L 33/32     (2010.01)
    H01L 33/06     (2010.01)
    H01L 33/14     (2010.01)

(52) U.S. Cl.
    CPC ............... H01L 33/32 (2013.01); H01L 33/06 (2013.01); H01L 33/14 (2013.01)

(58) Field of Classification Search
    CPC ..... H01L 33/32; H01L 33/06; H01L 33/0025; H01L 33/14; H01L 33/04; H01L 33/22
    USPC ............. 257/9, 12–15, 79; 438/22, 37, 46, 47
    See application file for complete search history.

(56) References Cited

U.S. PATENT DOCUMENTS

| | | | |
|---|---|---|---|
| 6,388,275 B1 | 5/2002 | Kano | 257/94 |
| 2006/0091404 A1* | 5/2006 | Shen et al. | 257/79 |
| 2007/0045655 A1 | 3/2007 | Song et al. | 257/104 |
| 2008/0149918 A1 | 6/2008 | Yoo et al. | 257/17 |
| 2009/0315078 A1* | 12/2009 | Parikh et al. | 257/194 |
| 2011/0240957 A1* | 10/2011 | Okuno et al. | 257/13 |
| 2011/0272719 A1* | 11/2011 | Chen et al. | 257/94 |

(Continued)

FOREIGN PATENT DOCUMENTS

| | | |
|---|---|---|
| EP | 1 018 770 A1 | 7/2000 |
| JP | 2008-141047 A | 6/2008 |

(Continued)

OTHER PUBLICATIONS

European Search Report dated Oct. 24, 2014 issued in Application No. 14 172 901.2.

*Primary Examiner* — Hsien Ming Lee
(74) *Attorney, Agent, or Firm* — KED & Associates LLP

(57) ABSTRACT

Disclosed are a light emitting device, a method of fabricating a light emitting device, a light emitting device package, and a lighting system. The light emitting device includes a first conductive semiconductor layer (112), an $In_xGa_{1-x}N$ layer (where, $0<x\le1$) (151) on the first conductive semiconductor layer (112), a GaN layer (152) on the $In_xGa_{1-x}N$ layer (151), a first $Al_{y1}Ga_{1-y1}N$ layer (where, $0<y1\le1$) (153) on the GaN layer (152), an active layer (114) on the first $Al_{y1}Ga_{1-y1}N$ layer (153), and a second conductive semiconductor layer (116) on the active layer (114).

17 Claims, 5 Drawing Sheets

(56) References Cited

U.S. PATENT DOCUMENTS

2012/0043526 A1 2/2012 Moon et al. ............. 257/13
2012/0211724 A1* 8/2012 Kikuchi et al. ........... 257/13

FOREIGN PATENT DOCUMENTS

| KR | 10-2004-0016723 A | 2/2004 |
| KR | 10-2008-0050942 A | 6/2008 |

* cited by examiner

US 9,236,531 B2

LIGHT EMITTING DEVICE AND LIGHTING SYSTEM

CROSS-REFERENCE TO RELATED APPLICATION(S)

This application claims priority under 35 U.S.C. §119 to Korean Application No. 10-2013-0069782 filed on Jun. 18, 2013, whose entire disclosure(s) is/are hereby incorporated by reference.

BACKGROUND

1. Field

The embodiment relates to a light emitting device, a method of fabricating the light emitting device, a light emitting device package, and a lighting system.

2. Background

A light emitting device includes a P-N junction diode having a characteristic of converting electrical energy into light energy. The light emitting device may include compound semiconductors belonging to group III and V on the periodic table. The light emitting device can represent various colors by adjusting the compositional ratio of the compound semiconductors.

When forward voltage is applied to the LED, electrons of an N layer are combined with holes of a P layer, so that energy corresponding to an energy gap between a conduction band and a valance band may be generated. The energy is mainly emitted in the form of heat or light. In the case of the LED, the energy is generated in the form of light.

For example, a nitride semiconductor represents superior thermal stability and wide bandgap energy so that the nitride semiconductor has been spotlighted in the field of optical devices and high-power electronic devices. In particular, blue, green, and UV light emitting devices employing the nitride semiconductor have already been commercialized and extensively used.

Recently, as the demand for the high-efficiency LED has been increased, the improvement of luminous intensity has been issued. According to the related art, as current is increased, a current crowding phenomenon occurs to lower light output power (Po), which is called "current crowding phenomenon".

Accordingly, the requirements for the improvement in current spreading and luminous intensity are increased in order to overcome current crowding.

In addition, according to the related art, electrons (hot electrons) representing high mobility are not confined in a quantum well, but overflowed into the P type semiconductor layer, so that light emission efficiency is lowered.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Hereinafter, a light emitting device, a light emitting device package, and a lighting system according to the embodiment will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiment)

Figure 1:
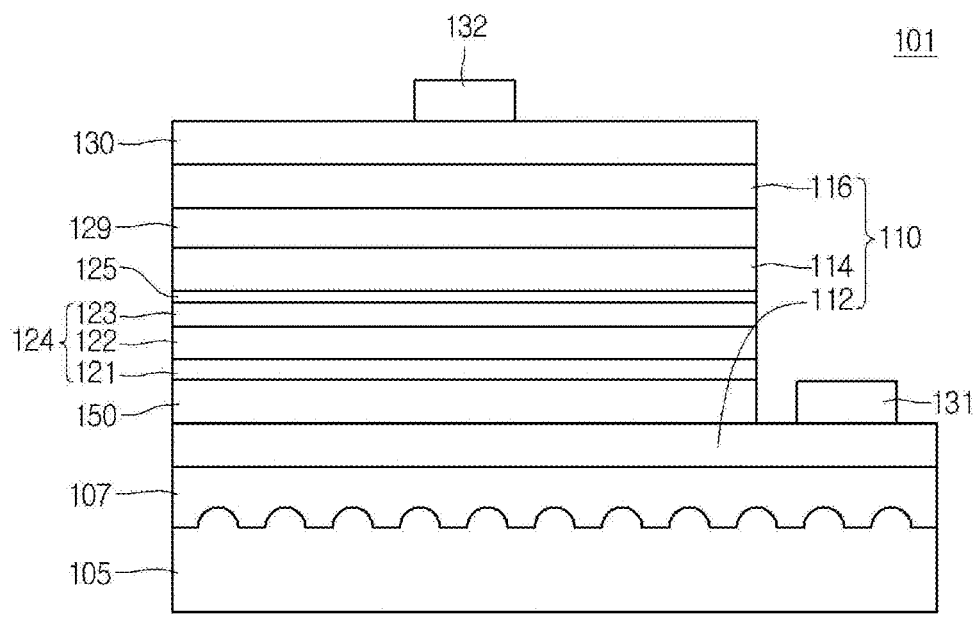
FIG. 1 is a sectional view showing a light emitting device according to the first embodiment.
Figure 2:
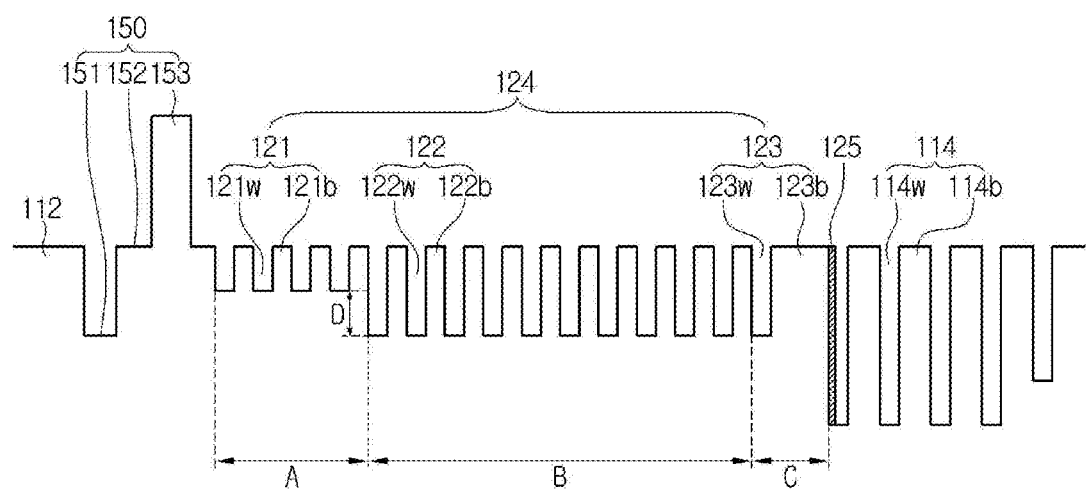
FIG. 2 is a view showing an energy band diagram of the light emitting device according to the first embodiment.

FIG. 1 is a sectional view showing a light emitting device 101 according to a first embodiment, and FIG. 2 is a view showing an energy band diagram of the light emitting device 100 according to the first embodiment.

The light emitting device 101 according to the embodiment includes a first conductive semiconductor layer 112, an $In_xGa_{1-x}N$ layer (where $0<x\le1$) 151 on the first conductive semiconductor layer 112, a GaN layer 152 on the $In_xGa_{1-x}N$ layer 151, a first $Al_{y1}Ga_{1-y1}N$ layer (where $0<y1\le1$) 153 on the GaN layer 152, an active layer 114 on the first $Al_{y1}Ga_{1-y1}N$ layer 153, and a second conductive semiconductor layer 116 on the active layer 114.

In addition, the embodiment further includes a GaN-based superlattice layer 124 interposed between the first $Al_{y1}Ga_{1-y1}N$ layer 153 and the active layer 114. The GaN-based superlattice layer 124 may have a bandgap energy level reduced in the direction from the first conductive semiconductor layer 112 toward the active layer 114.

Figure 3:
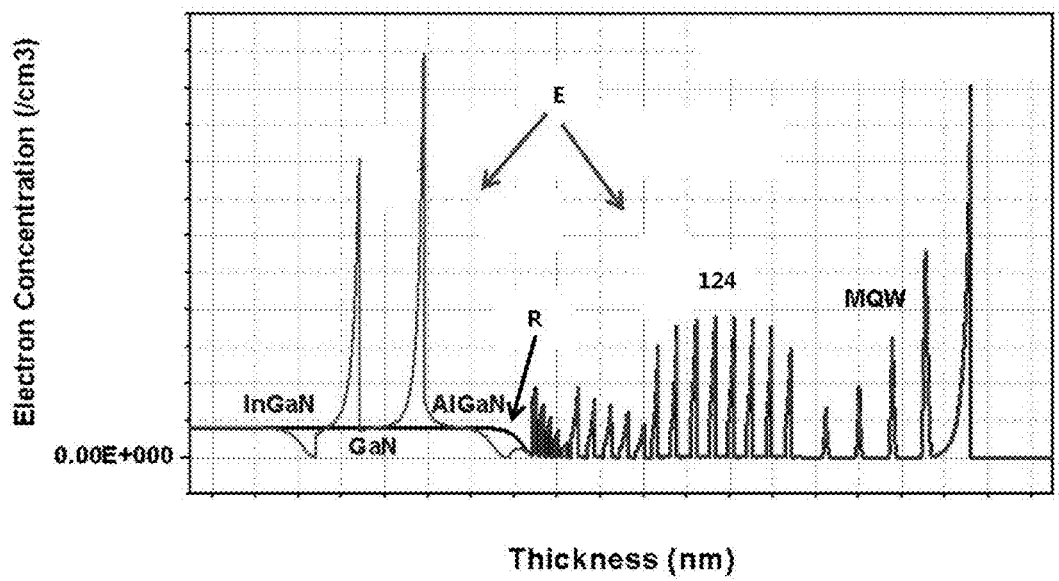
FIG. 3 is a graph showing electron concentration data of a light emitting device according to the embodiment.

FIG. 3 is a graph showing electron concentration data of the light emitting device 100 according to the embodiment.

According to the embodiment, if the light emitting device 100 has the structure shown in FIG. 2, the light emitting device 100 may have the electron concentration gradient shown in FIG. 3.

According to the embodiment, a current spreading structure 150 including the $In_xGa_{1-x}N$ layer 151/GaN layer 152/first $Al_{y1}Ga_{1-y1}N$ layer 153 is provided under the active layer 114, thereby efficiently spreading electrons to overcome an efficiency droop phenomenon in which light output power (Po) is decreased due to the current increase.

For example, according to the embodiment, the tunneling of electrons is possible due to the structure of the $In_xGa_{1-x}N$ layer 151/GaN layer 152/first $Al_{y1}Ga_{1-y1}N$ layer 153, so that electrons can be efficiently spread to overcome the efficiency droop phenomenon.

The concentration of In contained in the $In_xGa_{1-x}N$ layer 151 may be in the range of 2% to 15%. In order to make the meaningful bandgap energy difference between the InxGa1-xN layer 151 and GaN layer 152, the concentration of In may be 2% or more. In order to prevent electrons from being trapped, the concentration of In may not exceed 15%.

As shown in FIG. 2, the GaN-based superlattice layer 124 according to the embodiment may have the bandgap energy level reduced in the direction from the first conductive semiconductor layer 112 toward the active layer 114.

For example, the GaN-based superlattice layer 124 may have the bandgap energy level reduced in the form of a step in the direction from the first conductive semiconductor layer 112 toward the active layer 114, but the embodiment is not limited thereto.

For example, the GaN-based superlattice layer 124 may include a first-group GaN-based superlattice layer 121 having first bandgap energy at an area A adjacent to the first conductive semiconductor layer 112 and a second-group GaN-based superlattice layer 122 having second bandgap energy lower than the first bandgap energy on the first conductive semiconductor layer 112 (area B).

In addition, the GaN-based superlattice layer 124 may further include a third-group GaN-based superlattice layer 123 having third bandgap energy, provided on the second-group GaN-based superlattice layer 122, and provided at an area C adjacent to the active layer 114.

The third bandgap energy may be equal to or lower than the second bandgap energy, but the embodiment is not limited thereto.

In this case, the first-group GaN-based superlattice layer 121 may include a first-group well 121$w$ and a first-group barrier 121$b$, the second-group GaN-based superlattice layer may include a second-group well 122$w$ and a second-group barrier 122$b$, and the third-group GaN-based superlattice layer 123 may include a third-group well 123$w$ and a third-group barrier 123$b$.

The GaN-based superlattice layer 124 may include an InxGa1-xN/GaN superlattice layer (where, 0<x≤1), and the difference D between the first and second energy bandgap levels may be equal to or higher than a photon energy level of the GaN-based superlattice layer.

For example, only when the difference (energy difference) of a well depth in the GaN-based superlattice layer belonging to each group is equal to or higher than the phonon energy (about 88 meV) of InGaN, a portion of the energy of hot electrons may be transferred in the form of the phonon energy.

The GaN-based superlattice layer 124 according to the embodiment has at least two energy steps and the depth of a quantum well (multi-quantum well) 114$w$ of the active layer 114 is about 200 meV, so a plurality of energy steps can be provided and the number of the energy steps may be determined by dividing the depth of the quantum well by the minimum phonon energy.

According to the embodiment, the energy level of each group may be adjusted by adjusting the concentration of In contained in the well of each group.

For example, the concentration of In contained in the second-group GaN-based superlattice layer may be set to a value lower than that of In contained in the first-group GaN-based superlattice layer 121, thereby reducing the energy level of the second-group well 122$w$ to lower than the energy level of the first-group well 121$w$.

According to the embodiment, hot electrons are cooled by the GaN-based superlattice layer having a plurality of energy steps, so that a high-power light emitting device having an effective electron injection layer can be provided.

According to the embodiment, the thickness of the GaN-based superlattice layer of each group may be controlled in order to improve the electron injection efficiency by efficiently cooling the hot electrons.

For example, the thickness of the first-group GaN-based superlattice layer 121 may be thinner than the thickness of the second-group GaN-based superlattice layer 122.

In this case, the thickness of the first-group well 121$w$ of the first-group GaN-based superlattice layer 121 may be equal to the thickness of the first-group barrier 121$b$ of the first-group GaN-based superlattice layer 121 and the first-group well 121$w$ and the first group barrier 121$b$ may be prepared with a plurality of cycles. For example, the first-group well 121$w$ and the first-group barrier 121$b$ may be controlled to have the same thickness in the range of about 1 nm to 3 nm and may be prepared with a plurality of cycles so that the hot carriers can be effectively cooled as compared with a case where a single thick well and a single thick barrier are presented.

In addition, the second-group well 122$w$ and the second-group barrier 122$b$ of the second-group GaN-based superlattice layer 122 may be controlled to have the same thickness in the range of about 1 nm to 3 nm and may be prepared with a plurality of periodicities so that the hot carriers can be effectively cooled as compared with a case where a single thick well and a single thick barrier are presented.

At this time, the thickness of the second-group well 122$w$ may be equal to the thickness of the first-group well 121$w$ and the thickness of the second-group barrier 122$b$ may be equal to the thickness of the first-group barrier 121$b$. Thus, even if the carriers recognize a predetermined energy barrier in the GaN-based superlattice layer, the carriers may not be extinguished within the GaN-based superlattice layer due to the well and the barrier having the regular thickness, so that the carriers can be smoothly injected.

According to the embodiment, the total thickness of the second-group GaN-based superlattice layer 122 may be thicker than the total thickness of the first-group GaN-based superlattice layer 121. For example, the second-group GaN-based superlattice layer 122 may include the second-group well 122$w$ and the second-group barrier 122$b$ repeatedly formed with about 8 to 12 cycles and the first-group GaN-based superlattice layer 121 may include the first-group well 121$w$ and the first-group barrier 121$b$ repeatedly formed with about 3 to 5 cycles.

According to the embodiment, the hot carriers can be stably cooled for longer time in the second-group GaN-based superlattice layer 122 that meets partially-cooled hot carriers rather than the first-group GaN-based superlattice layer 121 that primarily meets the hot carriers, so the hot carriers may be efficiently cooled without being overflowed.

In addition, according to the embodiment, the thickness of the third-group well 123$w$ of the third-group GaN-based superlattice layer 123 may be equal to the thickness of the second-group well 122$w$ and thinner than the thickness of the third-group barrier 123$b$.

For example, the thickness of the third-group well 123$w$ may be in the range of about 1 nm to about 3 nm, and the thickness of the third-group barrier 123$b$ may be in the range of about 7 nm to about 11 nm, but the embodiment is not limited thereto.

According to the embodiment, the third-group barrier 123$b$ may be adjacent to the active layer 114, and the thickness of the third-group barrier 123$b$, which is the final barrier, may be thicker than that of the barriers and wells of other groups.

According to the embodiment, the third-group barrier 123$b$ may be doped with a first conductive element to improve the electron injection efficiency In addition, according to the embodiment, an undoped GaN layer 125 is further provided between the third-group barrier 123b and the quantum well 114w of the active layer 114 to prevent the first conductive element doped in the third-group barrier 123b from diffusing into the active layer 114 and blocking the recombination for light emission.

According to the embodiment, the hot electrons are cooled by the GaN-based superlattice layer having a plurality of energy steps, so that the high-power light emitting device having the effective electron injection layer can be provided.

According to the embodiment, the light emitting device capable of improving luminous intensity by improving current spreading, a method of fabricating the light emitting device, the light emitting device package, and the lighting system can be provided.

In addition, according to the embodiment, the light emitting device capable of improving light emission efficiency by confining electrons into the active layer, the method of fabricating the light emitting device, the light emitting device package, and the lighting system can be provided.

Figure 4:
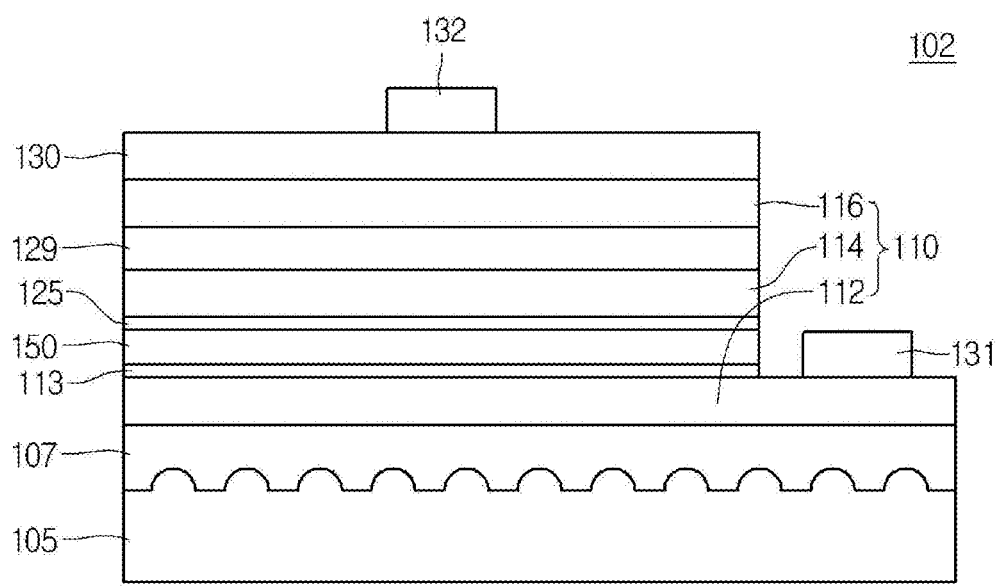
FIG. 4 is a sectional view showing the light emitting device according to the second embodiment.
Figure 5:
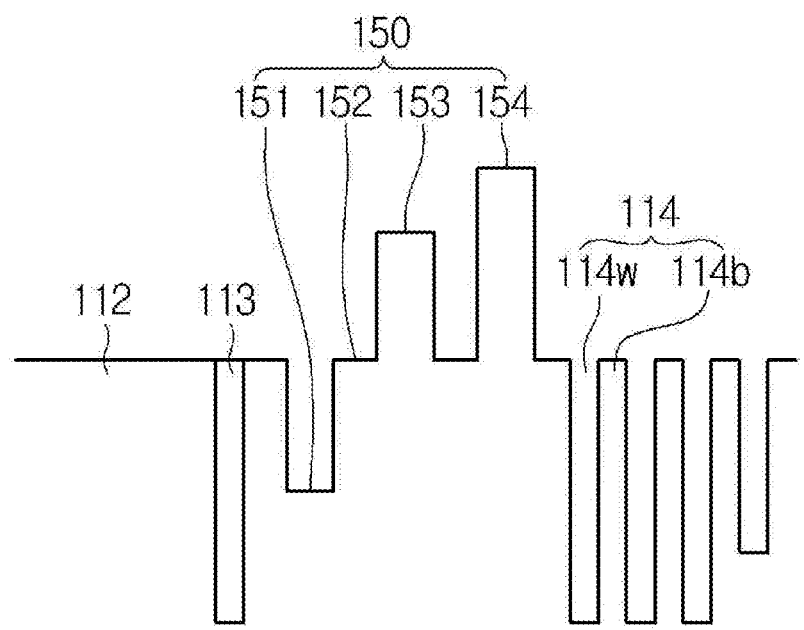
FIG. 5 is a graph showing an energy band diagram of the light emitting device according to the second embodiment.

FIG. 4 is a sectional view showing a light emitting device 102 according to a second embodiment, and FIG. 5 is a graph showing an energy band diagram of the light emitting device 102 according to the second embodiment.

The light emitting device 102 according to the second embodiment may employ the technical features of that of the first embodiment.

According to the second embodiment, differently from the first embodiment, the GaN-based superlattice layer 124 may not be provided.

In addition, the light emitting device 102 according to the second embodiment may further include a second Aly2Ga1-y2N layer (where, $0<y2\leq1$) 154 between the first Aly1Ga1-y1N layer (where $0<y1\leq1$) 153 and the active layer 114.

The bandgap energy of the second Aly2Ga1-y2N layer 154 may be higher than the bandgap energy of the first Aly1Ga1-y1N layer 153.

Accordingly, the tunneling effect of electrodes is increased to enhance current spreading, thereby overcoming the efficiency droop phenomenon.

In addition, according to the second embodiment, a second-concentration first conductive semiconductor layer 113 having a second concentration higher than the concentration of the first conductive semiconductor layer 112 may be further provided between the first conductive semiconductor layer 112 and the InxGa1-xN layer 151.

The bandgap energy of the second-concentration first conductive semiconductor layer 113 may be heavier than that of the InxGa1-xN layer 151.

According to the embodiment, the second-concentration first conductive semiconductor layer 113 is provided to increase carrier injection efficiency, and current is spread in a light emitting device chip through the current spreading structure 150 in which heavily-doped electrodes spread current, thereby effectively overcoming the efficiency droop phenomenon.

Hereinafter, the method of fabricating the light emitting device according to the embodiment will be described with reference to FIGS. 6 and 7. Even if the method of fabricating the light emitting device according to the first embodiment will be described with reference to FIGS. 6 and 7, the embodiment is not limited thereto.

Figure 6:
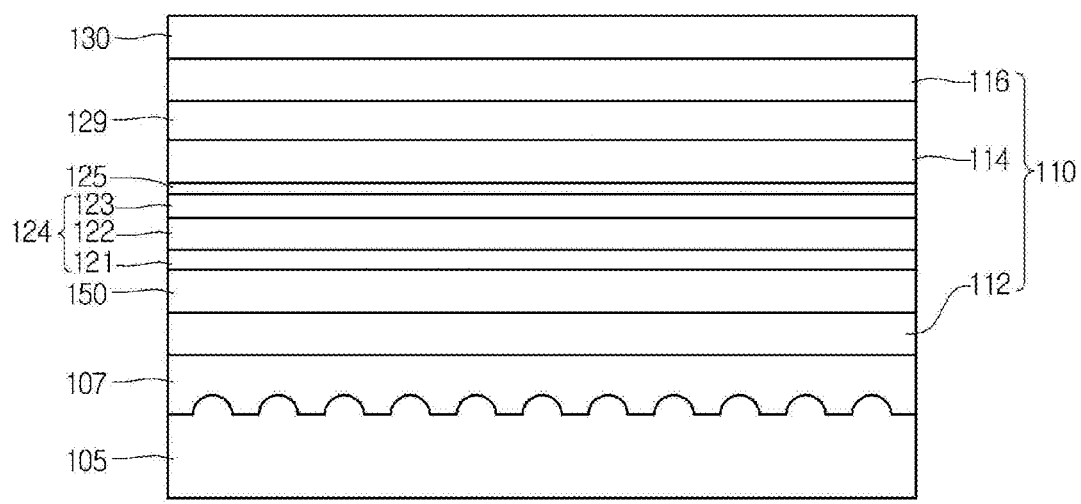
FIGS. 6 to 7 are sectional views showing the manufacturing process of the light emitting device according to the embodiment.

Meanwhile, although FIG. 6 shows a lateral-type light emitting device in that the light emitting device 101 according to the embodiment is grown on a predetermined growth substrate 105, the embodiment is not limited thereto. The embodiment is applicable to a vertical-type light emitting device in which an electrode is formed on the first conductive semiconductor layer exposed to the outside after the growth substrate has been removed.

First, in the light emitting device according to the embodiment as shown in FIG. 6, the substrate 105 may include a material representing superior thermal conductivity. The substrate 105 may include a conductive substrate or an insulating substrate. For example, the substrate 105 may include at least one of sapphire (Al2O3), SiC, Si, GaAs, GaN, ZnO, GaP, InP, Ge, and Ga2O3.

According to the embodiment, a light reflective pattern is provided to increase light extraction efficiency. For example, the substrate 105 may include a patterned sapphire substrate (PSS) to increase the light extraction efficiency.

In addition, according to the embodiment, a buffer layer 107 and an undoped semiconductor layer (not shown) are formed on the substrate 105 to attenuate the lattice mismatch between a material of the light emitting structure 110 and a material of the substrate 105. For example, the buffer layer 107 may be formed of group III-V compound semiconductors. In detail, the buffer layer 107 may include at least one of GaN, InN, AlN, InGaN, AlGaN, InAlGaN, and AlInN, but the embodiment is not limited thereto.

Then, a first conductive semiconductor layer 112 is formed on the undoped semiconductor layer. For example, the first conductive semiconductor layer 112 may include a semiconductor material having a compositional formula of InxAlyGa1-x-yN ($0\leq x\leq1$, $0\leq y\leq1$, and $0\leq x+y\leq1$). In detail, the first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP, but the embodiment is not limited thereto.

Next, the current spreading structure 150 including the InxGa1-xN layer 151/GaN layer 152/first Aly1Ga1-y1N layer 153 is provided on the first conductive semiconductor layer 112, thereby efficiently spreading electrons to overcome an efficiency droop phenomenon in which light output power (Po) is decreased due to the current increase.

For example, according to the embodiment, the tunneling of electrons is possible due to the structure of the InxGa1-xN layer 151/GaN layer 152/first Aly1Ga1-y1N layer 153, so that electrons can be efficiently spread to overcome the efficiency droop phenomenon.

According to the embodiment, the bandgap energy of the GaN layer 152 may be higher than the bandgap energy of the InxGa1-xN layer 151.

The bandgap energy of the GaN layer 152 may be lower than the bandgap energy of the first Aly1Ga1-y1N layer 153.

In addition, the bandgap energy of the InxGa1-xN layer 151 may be higher than that of the quantum well 114w in the active layer 114.

Further, the bandgap energy of the first Aly1Ga1-y1N layer 153 may be higher than that of a quantum barrier 114b in the active layer 114.

According to the embodiment, any one of the energy bandgap structures is provided, so that the tunneling of electrons is possible, thereby overcoming the efficiency droop phenomenon.

The concentration of In contained in the InxGa1-xN layer 151 may be in the range of 2% to 15%. In order to make the meaningful bandgap energy difference between the InxGa1-xN layer 151 and GaN layer 152, the concentration of In may be 2% or more. In order to prevent electrons from being trapped, the concentration of In may not exceed 15%.

The GaN-based superlattice layer 124 may be formed on the current spreading structure 150, and the GaN-based superlattice layer 124 may have a bandgap energy level reduced in the direction from the first conductive semiconductor layer 112 toward the active layer 114.

For example, according to the embodiment, the GaN-based superlattice layer 124 may include the first-group GaN-based superlattice layer 121 having the first bandgap energy and the second-group GaN-based superlattice layer 122 having the second bandgap energy lower than the first bandgap energy and provided on the first-group GaN-based superlattice layer 121.

In addition, the GaN-based superlattice layer 124 may further include the third-group GaN-based superlattice layer 123 having the third bandgap energy and provided on the second-group GaN-based superlattice layer 122.

In this case, the first-group GaN-based superlattice layer 121 may include the first-group well 121w and the first-group barrier 121b, the second-group GaN-based superlattice layer may include the second-group well 122w and the second-group barrier 122b, and the third-group GaN-based superlattice layer 123 may include the third-group well 123w and the third-group barrier 123b.

The GaN-based superlattice layer 124 may include the InxGa1-xN/GaN superlattice layer (where, 0<x<1), and the difference D between the first and second energy bandgap levels may be equal to or higher than a photon energy level of the GaN-based superlattice layer.

According to the embodiment, the growth temperature of the first-group well 121w of the first-group GaN-based superlattice layer 121 may be higher than the growth temperature of the second-group well 122w of the second-group GaN-based superlattice layer 122. For instance, the first-group well 121w may be grown at the temperature of about 500 or below and the second-group well 122w may be grown at the temperature of about 900 or above.

The GaN-based superlattice layer 124 may be grown at the temperature of about 800 or above.

According to the embodiment, the amount of indium (In) in the well in the GaN-based superlattice layer 124 of each group may be controlled through PL (photo luminescence) sub-peak position, but the embodiment is not limited thereto.

According to the embodiment, the energy level of each group can be controlled by controlling concentration of indium in the well of each group. For example, the concentration of indium in the second-group GaN-based superlattice layer 122 is set higher than a concentration of indium in the first-group GaN-based superlattice layer 121. In this case, the energy level of the second-group well 122w may be lower than the energy level of the first-group well 121w.

According to the embodiment, hot electrons are cooled by the GaN-based superlattice layer having a plurality of energy steps, so that a high-power light emitting device having an effective electron injection layer can be provided.

In addition, according to the embodiment, the thickness of the GaN-based superlattice layer of each group may be controlled in order to improve the electron injection efficiency by more efficiently cooling the hot electrons.

For example, the thickness of the first-group GaN-based superlattice layer 121 may be thinner than the thickness of the second-group GaN-based superlattice layer 122.

At this time, the thickness of the first-group well 121w of the first-group GaN-based superlattice layer 121 may be equal to the thickness of the first-group barrier 121b of the first-group GaN-based superlattice layer 121 and the first-group well 121w and the first-group barrier 121b may be prepared with a plurality of cycles. For example, the first-group well 121w and the first-group barrier 121b may be controlled to have the same thickness in the range of about 1 nm to 3 nm and may be prepared with a plurality of cycles so that the hot carrier can be efficiently cooled as compared with a case where a single thick well and a single thick barrier are presented.

In addition, the second-group well 122w and the second-group barrier 122b of the second-group GaN-based superlattice layer 122 may be controlled to have the same thickness in the range of about 1 nm to 3 nm and may be prepared with a plurality of cycles so that the hot carrier can be efficiently cooled as compared with a case where a single thick well and a single thick barrier are presented.

In this case, the thickness of the second-group well 122w may be equal to the thickness of the first-group well 121w and the thickness of the second-group barrier 122b may be equal to the thickness of the first-group barrier 121b. Thus, even if the carriers recognize a predetermined energy barrier in the GaN-based superlattice layer, the carriers may not be extinguished within the GaN-based superlattice layer due to the well and the barrier having the regular thickness, so that the carriers can be smoothly injected.

According to the embodiment, the total thickness of the second-group GaN-based superlattice layer 122 may be thicker than the total thickness of the first-group GaN-based superlattice layer 121.

According to the embodiment, the hot carriers can be stably cooled for longer time in the second-group GaN-based superlattice layer 122 that meets partially-cooled hot carriers rather than the first-group GaN-based superlattice layer 121 that primarily meets the hot carriers, so the hot carriers may be efficiently cooled without being overflowed.

In addition, according to the embodiment, the thickness of the third-group well 123w of the third-group GaN-based superlattice layer 123 may be equal to the thickness of the second-group well 122w and thinner than the thickness of the third-group barrier 123b.

According to the embodiment, the third-group barrier 123b may be adjacent to the active layer 114, and the thickness of the third-group barrier 123b, which is the final barrier, may be thicker than that of the barriers and wells of other groups.

According to the embodiment, the third-group barrier 123b is doped with a first conductive element to improve the electron injection efficiency. According to the embodiment, the third-group barrier 123b may be heavily doped with Si so that the electron injection efficiency can be improved. For example, the third-group barrier 123b may be doped with 19 cc or more of Si, but the embodiment is not limited thereto.

In addition, according to the embodiment, the undoped GaN layer 125 is further provided between the third-group barrier 123b and the quantum well 114w of the active layer 114 to prevent the first conductive element doped in the third-group barrier 123b from diffusing into the active layer 114 and blocking the recombination for light emission.

According to the embodiment, the hot electrons are cooled by the GaN-based superlattice layer having a plurality of energy steps, so that the high-power light emitting device having the effective electron injection layer can be provided.

Then, the active layer 114 is formed on the undoped GaN layer 125.

According to the embodiment, the active layer 114 may include at least one of a single quantum well structure, a multi quantum well (MQW) structure, a quantum wire structure, and a quantum dot structure.

For example, the active layer 114 may have the MQW structure formed by injecting TMGa gas, NH3 gas, N2 gas, and trimethyl indium (TMIn) gas, but the embodiment is not limited thereto.

The well layer 114w/barrier layer 114b of the active layer 114 may include at least one of InGaN/GaN, InGaN/InGaN, GaN/AlGaN, InAlGaN/GaN, GaAs (InGaAs)/AlGaAs, and GaP (InGaP)/AlGaP pair structures, but the embodiment is not limited thereto. The well layer may be formed of material having a bandgap lower than a bandgap of the barrier layer.

The barrier layer 114b may be grown under the conditions of the pressure of about 150 torr to about 250 torr and the temperature of about 750° C. to 800° C., but the embodiment is not limited thereto.

Then, according to the embodiment, a second conductive GaN-based layer 129 is formed on the active layer 114.

According to the embodiment, the second conductive GaN-based layer 129 performs an electron blocking function and an MQW cladding function of the active layer 114, so that the light emission efficiency can be improved. For example, the second conductive GaN-based layer 129 may include a semiconductor based on $Al_xIn_yGa_{(1-x-y)}N$ ($0 \leq x \leq 1$, $0 \leq y \leq 1$), and may have the energy bandgap higher than the energy bandgap of the active layer 114. The second conductive GaN-based layer 129 may have the thickness of about 100 Å to about 600 Å, but the embodiment is not limited thereto.

In addition, the second conductive GaN-based layer 129 may include an $Al_zGa_{(1-z)}N/GaN$ ($0 \leq z \leq 1$) superlattice layer, but the embodiment is not limited thereto.

P type ions are implanted into the second conductive GaN-based layer 129 to efficiently block overflowed electrons and enhance injection efficiency of holes. For example, Mg ions are implanted into the second conductive GaN-based layer 129 at the concentration in the range of about $10^{18}/cm^3$ to about $10^{20}/cm^3$ to efficiently block overflowed electrons and enhance injection efficiency of holes.

Next, the second conductive semiconductor layer 116 is formed on the second conductive GaN-based layer 129.

The second conductive semiconductor layer 116 may include a semiconductor compound. The second conductive semiconductor layer 116 may be realized by using groups III-V-II-VI compound semiconductors, and may be doped with second conductive type dopants.

For example, the second conductive semiconductor layer 116 may include a semiconductor material having a compositional formula of $In_xAl_yGa_{1-x-y}N$ ($0 \leq x \leq 1$, $0 \leq y \leq 1$, and $0 \leq x+y \leq 1$). If the second conductive semiconductor layer 116 is a P type semiconductor layer, the second conductive dopant, which serves as a P type dopant, may include Mg, Zn, Ca, Sr, or Ba.

Thereafter, the second conductive semiconductor layer 116 may be provided thereon with a transmissive electrode 130. The transmissive electrode 130 may include a transmissive ohmic layer, and may be formed by laminating single metal, or by laminating a metal alloy and metal oxide in a multi-layer such that carrier injection may be efficiently performed.

The transmissive electrode 130 may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO(In—Ga ZnO), ZnO, IrOx, RuOx, and NiO, but the embodiment is not limited thereto.

According to the embodiment, the first conductive semiconductor layer 112 may include an N type semiconductor layer and the second conductive semiconductor layer 116 may include a P type semiconductor layer, but the embodiment is not limited thereto. In addition, a semiconductor layer, such as an N type semiconductor layer (not illustrated) having polarity opposite to that of the second conductive semiconductor layer 116, may be formed on the second conductive semiconductor layer 116. Thus, the light emitting structure 110 may include one of an N-P junction structure, a P-N junction structure, an N-P-N junction structure, and a P-N-P junction structure.

Figure 7:
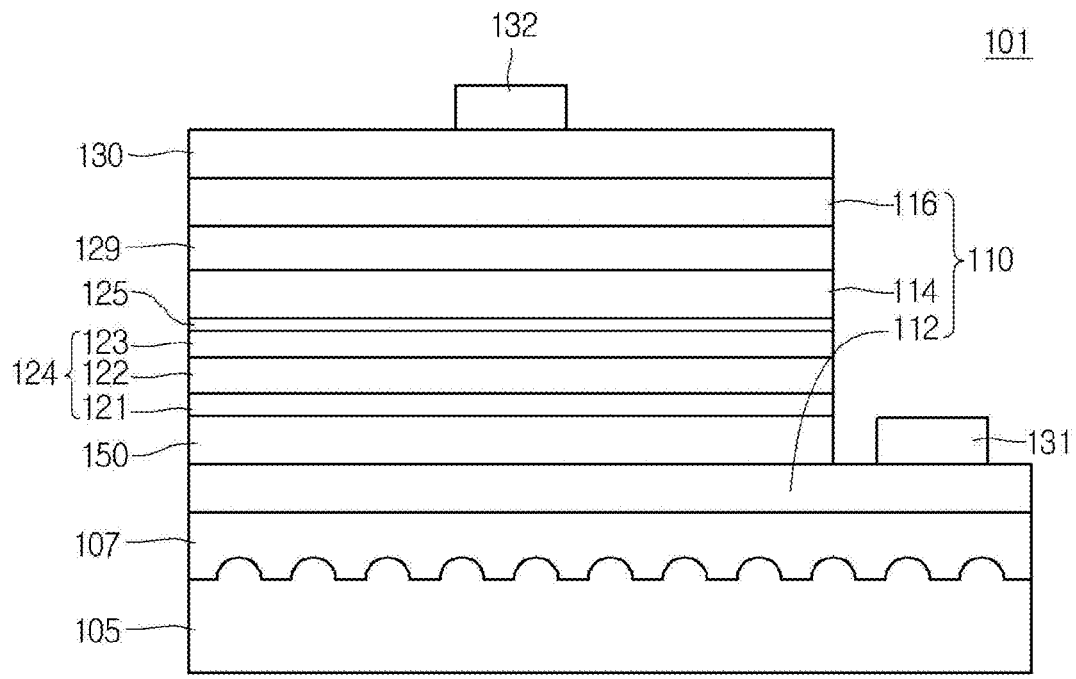

Subsequently, as shown in FIG. 7, portions of the transmissive electrode 130, the second conductive semiconductor layer 116, the second conductive GaN-based layer 129, the active layer 114, and the GaN-based superlattice layer 124 may be removed to expose the first conductive semiconductor layer 112 to the outside.

Then, a second electrode 132 is formed on the transmissive electrode 130, and a first electrode 131 is formed on the first conductive semiconductor layer 112 that is exposed.

According to the embodiment, the light emitting device capable of improving luminous intensity by improving current spreading, a method of fabricating the light emitting device, the light emitting device package, and the lighting system can be provided.

In addition, according to the embodiment, the light emitting device capable of improving light emission efficiency by confining electrons into the active layer, the method of fabricating the light emitting device, the light emitting device package, and the lighting system can be provided.

Figure 8:
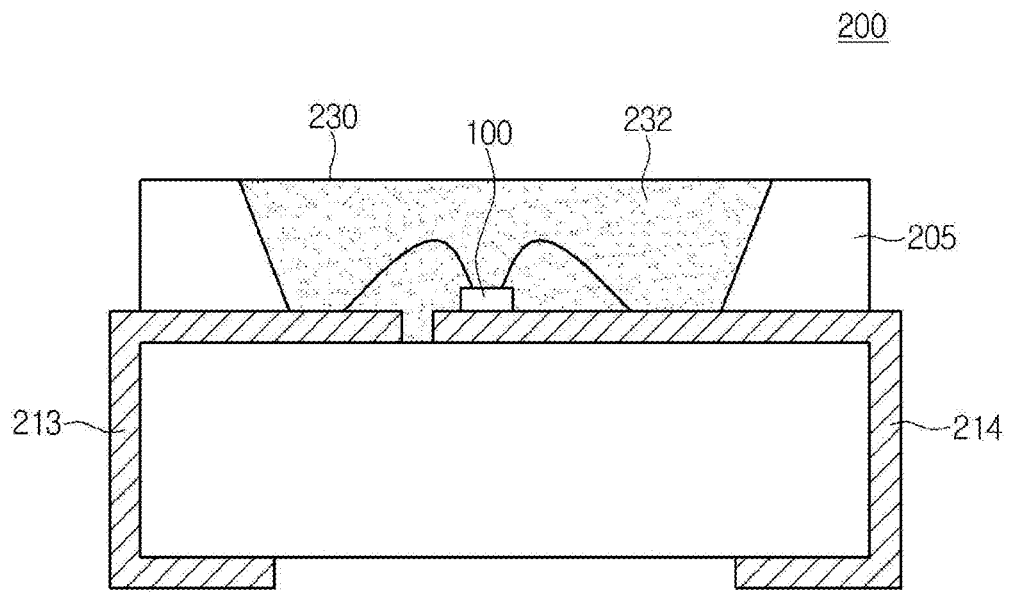
FIG. 8 is a sectional view illustrating a light emitting device package according to the embodiment.

FIG. 8 is a sectional view illustrating a light emitting device package 200 according to the embodiment.

The light emitting device package 200 according to the embodiment includes a package body 205, third and fourth electrode layers 213 and 214 formed on the package body 205, the light emitting device 100 provided on the package body 205 and electrically connected to the third and fourth electrode layers 213 and 214, and a molding member 240 that surrounds the light emitting device 100.

The package body 205 may include silicon, synthetic resin or metallic material. An inclined surface may be formed around the light emitting device 100.

The third and fourth electrode layers 213 and 214 may be are electrically isolated from each other to supply power to the light emitting device 100. In addition, the third and fourth electrode layers 213 and 214 reflect the light emitted from the light emitting device 100 to improve the light efficiency and dissipate heat generated from the light emitting device 100 to the outside.

The lateral type light emitting device shown in FIG. 1 can be employed as the light emitting device 100, but the embodiment is not limited thereto.

The light emitting device 100 may be installed on the package body 205 or the third and fourth electrode layers 213 and 214.

The light emitting device 100 is electrically connected to the third electrode layer 213 and/or the fourth electrode layer 214 through at least one of a wire bonding scheme, a flip chip bonding scheme and a die bonding scheme. According to the embodiment, the light emitting device 100 is electrically connected to the third electrode layer 213 through a wire and electrically connected to the fourth electrode layer 214 through the die bonding scheme, but the embodiment is not limited thereto.

The molding member 230 surrounds the light emitting device 100 to protect the light emitting device 100. In addition, the molding member 230 may include phosphors 232 to change the wavelength of the light emitted from the light emitting device 100.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 9:
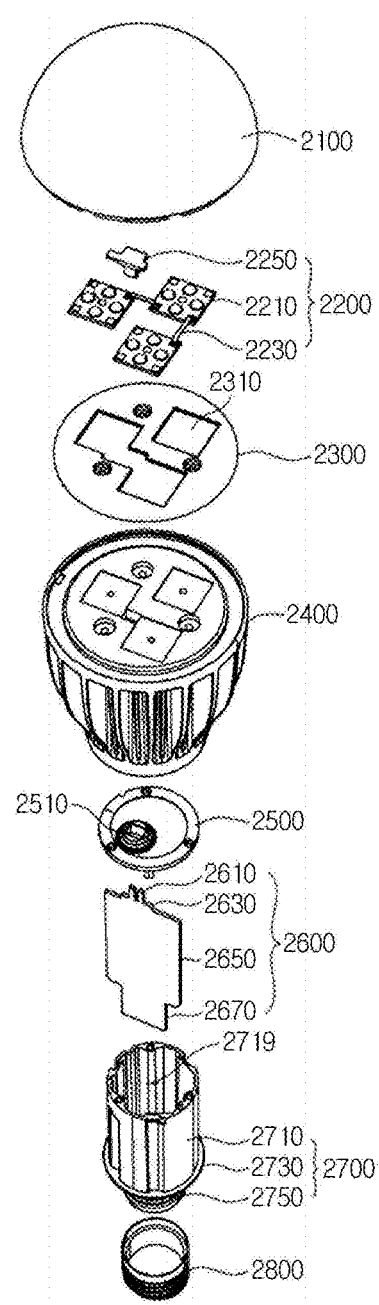
FIG. 9 is an exploded perspective view an example of a lighting system including the light emitting device according to the embodiment.

FIG. 9 is an exploded perspective view an example of a lighting system including the light emitting device according to the embodiment.

As shown in FIG. 9, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

According to the light emitting device, the method of manufacturing the same, the light emitting package, and the lighting system of the embodiment, the light extraction efficiency can be increased.

In addition, according to the embodiment, the optical efficiency can be increased.

The embodiment provides a light emitting device capable of improving luminous intensity by improving current spreading, a method of fabricating the light emitting device, a light emitting device package, and a lighting system.

In addition, the embodiment provides a light emitting device capable of improving light emission efficiency by confining electrons into an active layer, a method of fabricating the light emitting device, a light emitting device package, and a lighting system.

According to the embodiment, there is provided a light emitting device including a first conductive semiconductor layer (112), an $In_xGa_{1-x}N$ layer (where, $0 \leq x \leq 1$) (151) on the first conductive semiconductor layer (112), a GaN layer (152) on the $In_xGa_{1-x}N$ layer (151), a first $Al_{y1}Ga_{1-y1}N$ layer (where, $0 < y1 \leq 1$) (153) on the GaN layer (152), an active layer (114) on the first Al$_{y1}$Ga$_{1-y1}$N layer (153), and a second conductive semiconductor layer (116) on the active layer (114).

According to the embodiment, there is provided a light emitting device including a first conductive semiconductor layer (112), an In$_x$Ga$_{1-x}$N layer (where, 0<x≤1) (151) on the first conductive semiconductor layer (112), a GaN layer (152) on the In$_x$Ga$_{1-x}$N layer (151), a first Al$_{y1}$Ga$_{1-y1}$N layer (where, 0<y1≤1) (153) on the GaN layer (152), a GaN-based superlattice layer (124) on the first Al$_{y1}$Ga$_{1-y1}$N layer (153), an active layer (114) on the GaN-based superlattice layer (124), and a second conductive semiconductor layer (116) on the active layer (114). The GaN-based superlattice layer (124) may have a bandgap energy level reduced in a direction from the first conductive semiconductor layer (112) toward the active layer (114). A difference (D) between first and second energy bandgap levels may be equal to or higher than a photon energy level of the GaN-based superlattice layer (124).

In addition, there is provided a lighting system including a lighting unit including the light emitting device.

The embodiment can provide a light emitting device capable of improving luminous intensity by improving current spreading, a method of fabricating the light emitting device, a light emitting device package, and a lighting system.

The embodiment can a light emitting device capable of increasing light emission efficiency by confining electrons into an active layer, a method of fabricating the light emitting device, a light emitting device package, and a lighting system.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive semiconductor layer;
an In$_x$Ga$_{1-x}$N layer (where, 0<x≤1) on the first conductive semiconductor layer;
a GaN layer on the In$_x$Ga$_{1-x}$N layer;
a first Al$_{y1}$Ga$_{1-y1}$N layer (where, 0<y1≤1) on the GaN layer;
an active layer on the first Al$_{y1}$Ga$_{1-y1}$N layer;
a second conductive semiconductor layer on the active layer; and
a second Al$_{y2}$Ga$_{1-y2}$N layer (where 0<y2≤1), interposed between between the first Al$_{y1}$Ga$_{1-y1}$N layer and the active layer,
wherein the second Al$_{y2}$Ga$_{1-y2}$N layer has bandgap energy higher than bandgap energy of the first Al$_{y1}$Ga$_{1-y1}$N layer.

2. The light emitting device of claim 1, wherein indium contained in the In$_x$Ga$_{1-x}$N layer has concentration in a range of 2% to 15%.

3. The light emitting device of claim 1, wherein the GaN layer has bandgap energy higher than bandgap energy of the In$_x$Ga$_{1-x}$N layer.

4. The light emitting device of claim 1, wherein the GaN layer has bandgap energy lower than bandgap energy of the first Al$_{y1}$Ga$_{1-y1}$N layer.

5. The light emitting device of claim 1, wherein the In$_x$Ga$_{1-x}$N layer has bandgap energy higher than bandgap energy of a quantum well of the active layer.

6. The light emitting device of claim 1, wherein the first Al$_{y1}$Ga$_{1-y1}$N layer has bandgap energy higher than bandgap energy of a quantum barrier of the active layer.

7. The light emitting device of claim 1, further comprising a second-concentration first conductive semiconductor layer interposed between the first conductive semiconductor layer and the In$_x$Ga$_{1-x}$N layer.

8. The light emitting device of claim 7, wherein the second-concentration first conductive semiconductor layer has bandgap energy higher than bandgap energy of the In$_x$Ga$_{1-x}$N layer.

9. The light emitting device of claim 1, further comprising a GaN-based superlattice layer interposed between the first Al$_{y1}$Ga$_{1-y1}$N layer and the active layer.

10. The light emitting device of claim 9, wherein the GaN-based superlattice layer has a bandgap energy level reduced in a direction from the first conductive semiconductor layer toward the active layer.

11. The light emitting device of claim 10, wherein the GaN-based superlattice layer comprises a first-group GaN-based superlattice layer having first bandgap energy and a second-group GaN-based superlattice layer provided on the first conductive semiconductor layer and having second bandgap energy lower than the first bandgap energy.

12. The light emitting device of claim 11, wherein a difference between first and second bandgap energy levels is equal to or higher than a photon energy level of the GaN-based superlattice layer.

13. The light emitting device of claim 11, wherein the GaN-based superlattice layer further comprises a third-group GaN-based superlattice layer provided on the second-group GaN-based superlattice layer and having third bandgap energy.

14. The light emitting device of claim 11, wherein the first-group GaN-based superlattice layer has a thickness thinner than a thickness of the second-group GaN-based superlattice layer.

15. A lighting system comprising a lighting unit including the light emitting device according to claim 1.

16. A light emitting device comprising:
a first conductive semiconductor layer;
an In$_x$Ga$_{1-x}$N layer (where, 0<x≤1) on the first conductive semiconductor layer;
a GaN layer on the In$_x$Ga$_{1-x}$N layer;
a first Al$_{y1}$Ga$_{1-y1}$N layer (where, 0<y1≤1) on the GaN layer;
a GaN-based superlattice layer on the first Al$_{y1}$Ga$_{1-y1}$N layer, wherein the GaN-based superlattice layer comprises a first-group GaN-based superlattice layer having first bandgap energy and a second-group GaN-based superlattice layer provided on the first conductive semiconductor layer and having second bandgap energy lower than the first bandgap energy;

an active layer on the GaN-based superlattice layer; and a second conductive semiconductor layer on the active layer, wherein the GaN-based superlattice layer has a bandgap energy level reduced in a direction from the first conductive semiconductor layer toward the active layer, and a difference between the first and second bandgap energy levels is equal to or higher than a photon energy level of the GaN-based superlattice layer.

17. The light emitting device of claim 16, wherein the GaN-based superlattice layer further comprises a third-group GaN-based superlattice layer provided on the second-group GaN-based superlattice layer and having third bandgap energy.

* * * * *